(12) United States Patent
Shimizu et al.

(10) Patent No.: US 7,586,529 B2
(45) Date of Patent: Sep. 8, 2009

(54) SOLID-STATE IMAGING DEVICE

(75) Inventors: Katsutoshi Shimizu, Kyoto (JP); Masanori Minamio, Takatsuki (JP); Kouichi Yamauchi, Takatsuki (JP)

(73) Assignee: Panasonic Corporation, Osaka (JP)

( * ) Notice: Subject to any disclaimer, the term of this patent is extended or adjusted under 35 U.S.C. 154(b) by 595 days.

(21) Appl. No.: 10/969,822

(22) Filed: Oct. 21, 2004

(65) Prior Publication Data
US 2005/0088565 A1 Apr. 28, 2005

(30) Foreign Application Priority Data
Oct. 23, 2003 (JP) ............... 2003-363609

(51) Int. Cl.
H04N 3/14 (2006.01)
H01J 40/14 (2006.01)
H01L 21/00 (2006.01)
H04N 5/225 (2006.01)

(52) U.S. Cl. .................. 348/294; 250/239; 438/48; 348/340

(58) Field of Classification Search ................ 348/373, 348/231.4, 294, 340; 250/239; 438/48
See application file for complete search history.

(56) References Cited

U.S. PATENT DOCUMENTS

| 5,081,520 | A | 1/1992 | Yoshii et al. |
| 5,357,056 | A * | 10/1994 | Nagano ...................... 174/557 |
| 6,406,941 | B2 | 6/2002 | Nakamura |
| 6,599,770 | B2 * | 7/2003 | Miyamoto .................... 438/48 |
| 2001/0017405 | A1 | 8/2001 | Watanabe et al. |
| 2003/0155639 | A1 * | 8/2003 | Nakamura et al. .......... 257/680 |
| 2004/0140419 | A1 * | 7/2004 | Hsieh et al. ............. 250/214 R |

FOREIGN PATENT DOCUMENTS

| DE | 203 01 346 | 3/2003 |
| JP | 62-140742 | 9/1987 |
| JP | 5-343658 A | 12/1993 |
| JP | 2001-77277 | 3/2001 |
| JP | 2001-298032 A | 10/2001 |
| JP | 2003-078123 | 3/2003 |
| JP | 2003-152123 A | 5/2003 |
| JP | 2004-200629 A | 7/2004 |
| KR | 2001-0092663 | 10/2001 |

OTHER PUBLICATIONS

Japanese Office Action, dated Oct. 14, 2008.

* cited by examiner

Primary Examiner—Nhan T Tran
Assistant Examiner—Mekonnen Dagnew
(74) Attorney, Agent, or Firm—Hamre, Schumann, Mueller & Larson, P.C.

(57) ABSTRACT

A solid-state imaging-device includes a base, frame-shaped ribs provided on the base and forming an internal space, a plurality of wiring members for electrically leading the internal space of a housing formed by the base and the ribs to an external portion, an imaging element fixed to the base inside the internal space, a transparent plate fixed to an upper surface of the ribs, and connecting members electrically connecting electrodes of the imaging element to the wiring members, wherein a plurality of protrusions are provided in a region of the base that faces the imaging element, and the imaging element is fixed by adhesive to the base while being supported by the protrusions. The protrusions enable the imaging element to avoid distortion caused by following the surface of the base, thereby suppressing the effect on electrical properties of the imaging element.

35 Claims, 7 Drawing Sheets

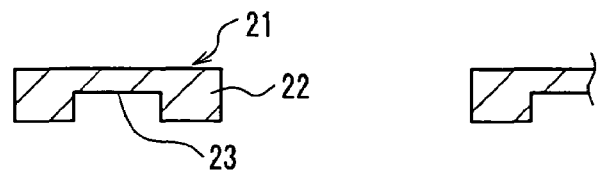
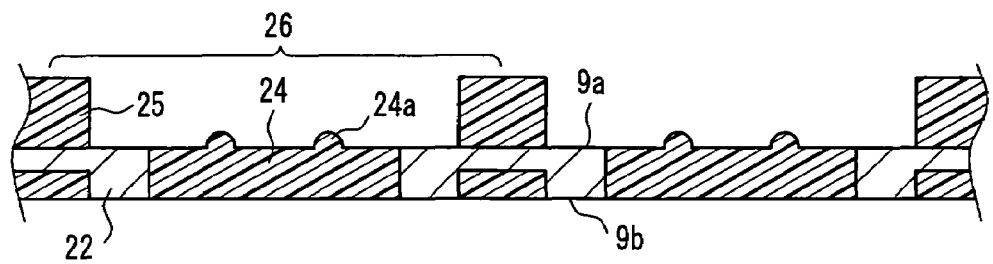
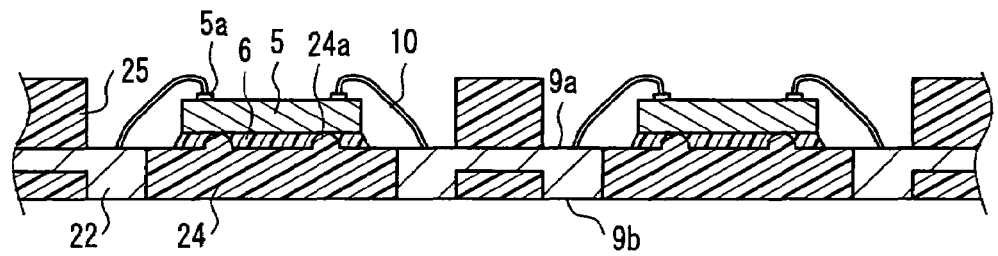
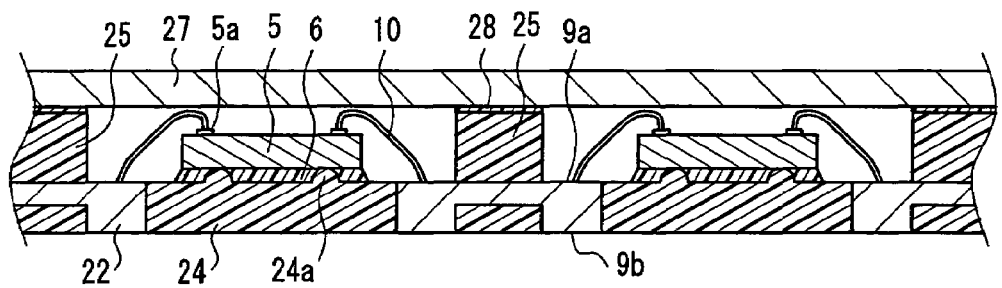
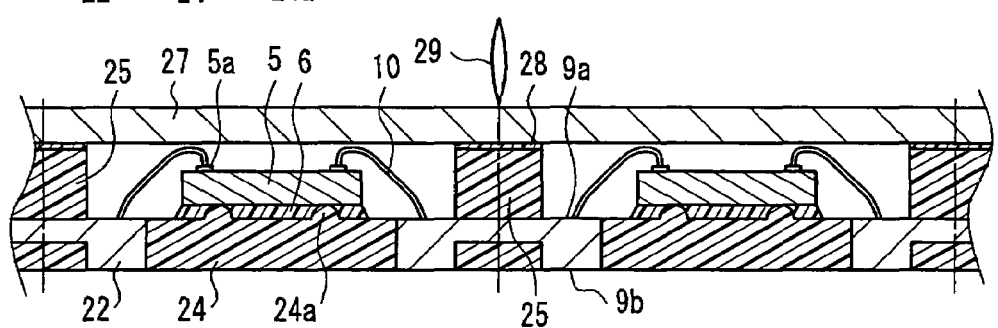
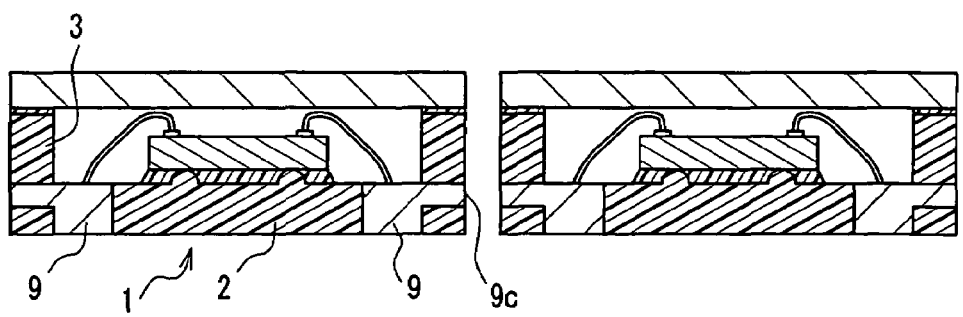

SOLID-STATE IMAGING DEVICE

FIELD OF THE INVENTION

The present invention relates to solid-state imaging devices in which an imaging element, such as a CCD or the like, is mounted in a housing.

BACKGROUND OF THE INVENTION

Solid-state imaging devices, which are widely used for video cameras and still cameras or the like, are provided in the form of a package, in which an imaging element, such as a CCD or the like, is mounted on a base made of an insulating material, with the photo-detecting region being covered by a transparent plate. In order to make the device more compact, the imaging element is mounted on the base as a bare chip. FIG. 9 shows the solid-state imaging device disclosed in JP 2001-77277, which is a conventional example of such a solid-state imaging device.

In FIG. 9, numeral 41 denotes a housing, which is made of a base 41a and frame-shaped ribs 41b formed in one piece by resin molding. An internal space 42 is formed on the upper side of the housing 41. A die pad 43 positioned at the center of the base 41a and leads 44 positioned below the ribs 41b are embedded in the housing 41. An imaging element chip 45 disposed at the center of the internal space 42 is fixed to the upper side of the die pad 43. The leads 44 include internal terminal portions 44a that are exposed to the internal space 42 at the upper side of the base 41a on the inner side of the ribs 41b and external terminal portions 44b that are exposed at the bottom side of the base 41a below the ribs 41b. The internal terminal portions 44a and the bonding pads of the imaging element chip 45 are connected by bonding wires 46 made of metal. A transparent sealing glass plate 47 is fixed to the upper surface of the ribs 41b, thus forming a package for protection of the imaging element chip 45.

This solid-state imaging device is mounted on a circuit board with the sealing glass plate 47 facing upward, as shown in FIG. 9, and the external terminal portions 44b are used to connect it to the electrodes on the circuit board. Although not shown in the drawings, a lens barrel incorporating an imaging optical system is mounted on top of the sealing glass plate 47 so that a relative position with respect to the photo-detecting region formed in the imaging element chip 45 is adjusted with a predetermined precision. During the imaging operation, object light that has passed through the imaging optical system incorporated in the lens barrel is focused on the photo-detecting region and photoelectrically converted.

Since a solid-state imaging device with such a configuration is connected at the external terminal portions 44b exposed from the bottom surface of the housing to electrodes on the circuit board, the height and the occupied surface area of the package are smaller than in configurations using a connecting structure with outer leads bent downward from the sides of the housing, thus making it suitable for high-density packaging.

In the configuration of the above-described conventional solid-state imaging device, it is necessary that the base 41a of the housing 41 has a sufficient degree of flatness. When, as conventionally, the imaging element chip 45 is fixed to the surface of the base 41a with adhesive, and the adhesive hardens, a force is caused that tends to make the imaging element chip 45 follow the surface of the base 41a. Thus, if the degree of flatness of the base 41a is not favorable, warping and internal stress are generated in the imaging element chip 45, and the electrical properties and the like of the imaging element chip 45 are adversely affected.

However, when the base 41a is molded, it is difficult to avoid a certain degree of twisting or warping of the cross-directional shape, and the degree of flatness is less than desired.

SUMMARY OF THE INVENTION

It is an object of the present invention to provide a solid-state imaging device in which, even if the imaging element is fixed to a base with unfavorable flatness, generation of distortions caused by the imaging element following the surface of the base can be avoided, and the effect on electrical properties of the imaging element caused by the distortions can be suppressed.

The solid-state imaging device of the present invention comprises a base, frame-shaped ribs provided on the base and forming an internal space, a plurality of wiring members for electrically leading the internal space of a housing formed by the base and the ribs to an external portion, an imaging element fixed to the base inside the internal space, a transparent plate fixed to an upper surface of the ribs, and connecting members electrically connecting electrodes of the imaging element to the wiring members. A plurality of protrusions are provided in a region of the base that faces the imaging element, and the imaging element is fixed by adhesive to the base while being supported by the protrusions.

BRIEF DESCRIPTION OF THE DRAWINGS

FIGS. 5A to 5F are cross-sectional views illustrating a method for manufacturing the solid-state imaging device in FIG. 1.

DESCRIPTION OF THE PREFERRED EMBODIMENTS

In the configuration of the solid-state imaging device according to the present invention, a plurality of protrusions are provided in a region in which an imaging element is mounted to the upper side of base which forms a housing, and the imaging element is fixed by an adhesive to the base while being supported by the protrusions. Consequently, the effect of the imaging element following the surface of the base is suppressed. Thus, even if the imaging element is fixed to a surface of a base which does not have a favorable degree of flatness, adverse effects on electrical properties caused by distortions is lessened.

In the configuration described above, it is preferable that the number of protrusions is not less than 3 and not greater than 5. Further, it is also preferable that the protrusions are substantially hemispherical. The configuration of the present invention is particularly effective with a configuration in which the base and the ribs are molded as one piece with a resin with the wire members embedded.

Figure 1:
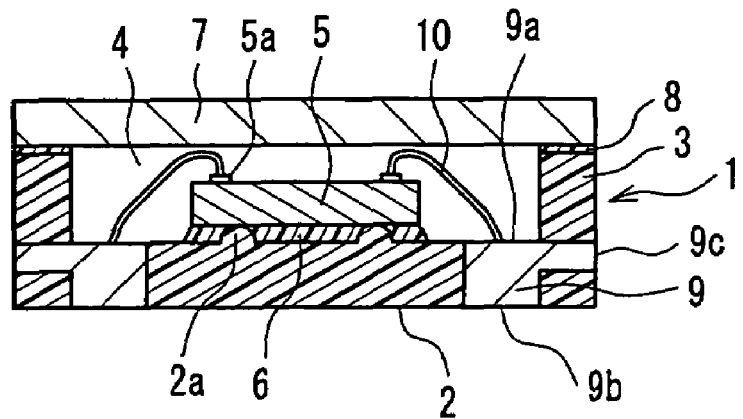
FIG. 1 is a cross-sectional view showing the configuration of a solid-state imaging device in accordance with an embodiment of the present invention.
Figure 2:
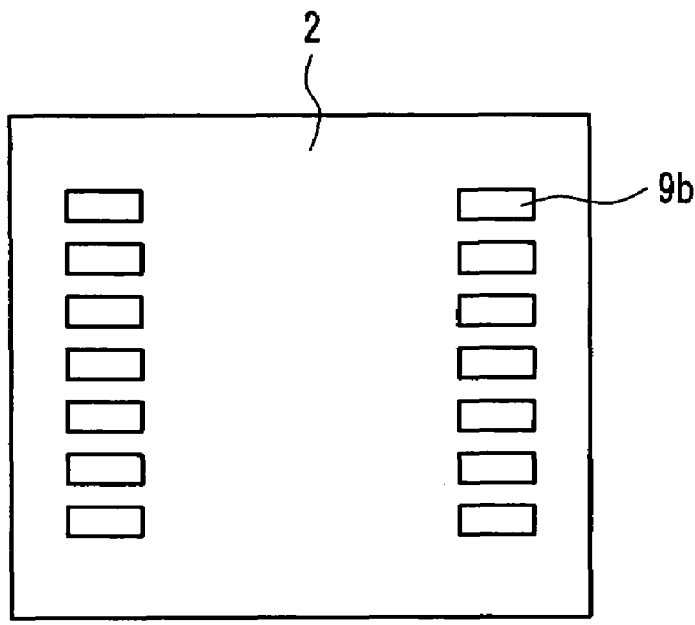
FIG. 2 is a bottom view of the solid-state imaging device of FIG. 1.
Figure 3:
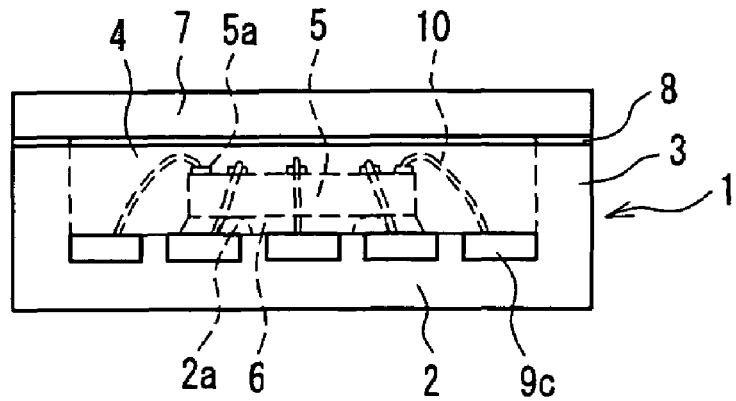
FIG. 3 is a lateral view of the solid-state imaging device of FIG. 1.

An embodiment of a solid-state imaging device according to the present invention is explained in further detail below with reference to the drawings. FIG. 1 is a cross-sectional view, FIG. 2 is a bottom view, and FIG. 3 is a lateral view of the solid-state imaging device.

Numeral 1 denotes a housing made of a plastic resin, such as epoxy resin, having ribs 3 arranged as a rectangular frame on a planar base 2 and fabricated by molding in one piece. An imaging element 5 is fixed by an adhesive 6 on a base 2 facing an internal space 4 of the housing 1. A transparent plate 7 made of glass, for example, is fixed with an adhesive 8 to the upper surface of the ribs 3, thus sealing the internal space 4 of the housing 1 and forming a package.

A plurality of hemispherical protrusions 2a are provided inside the region at the upper surface of the base 2 that faces the imaging element 5. Thus, the imaging element 5 is fixed by the adhesive 6 to the base 2 while being supported by the hemispherical protrusions 2a. Because of this, the imaging element 5 is substantially supported at points, and does not follow the surface of the base 2. As a result, the generation of distortions of the imaging element 5 caused by an unevenness of the base is suppressed. In practice, it is preferable that the number of hemispherical protrusions 2a is not less than 3 and not more than 5. It is preferable that the shape of the protrusions is substantially hemispherical, but other shapes are also applicable.

Figure 4:
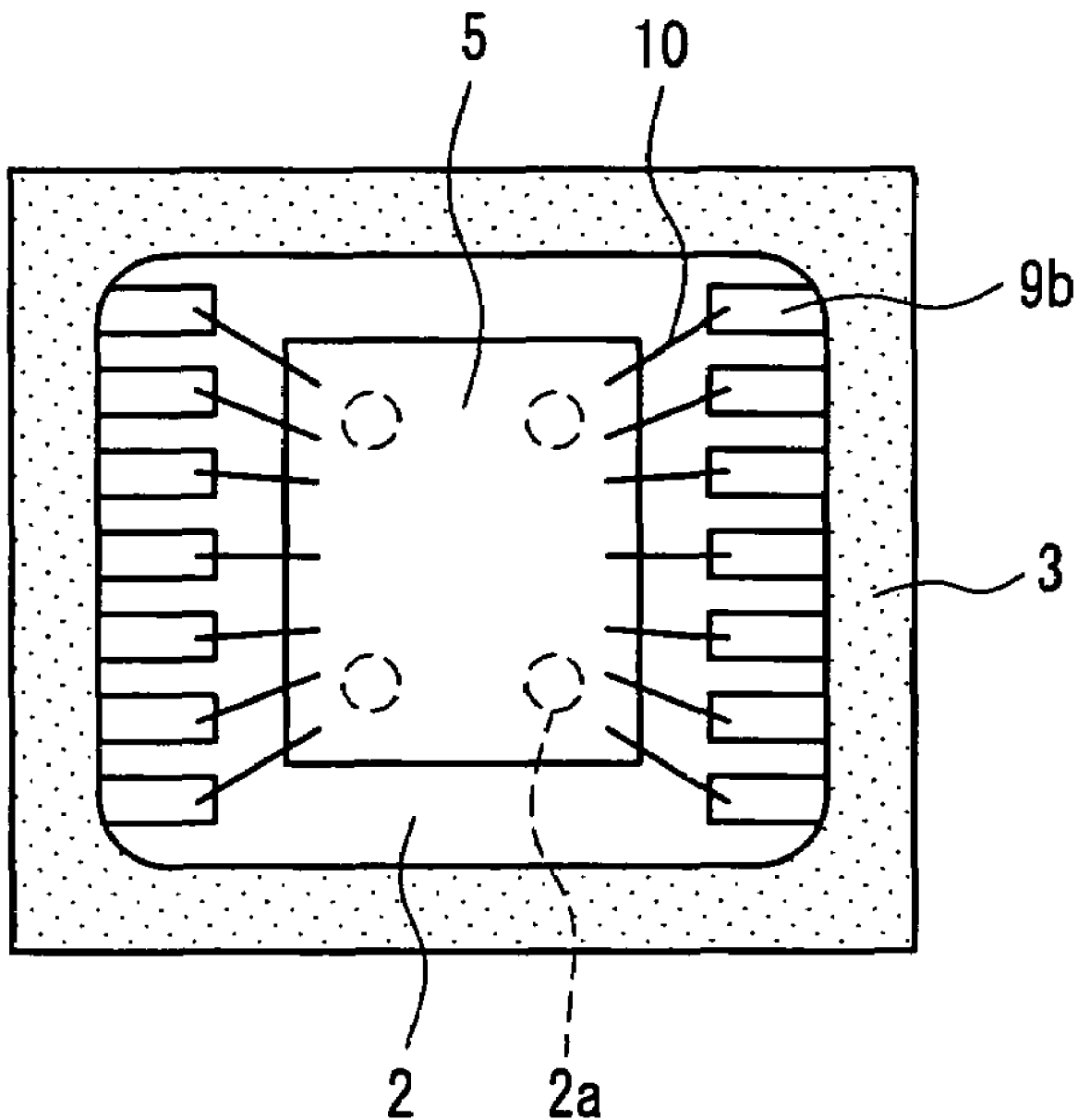
FIG. 4 is a top view of the solid-state imaging device in FIG. 1 without a transparent plate.
Figure 6:
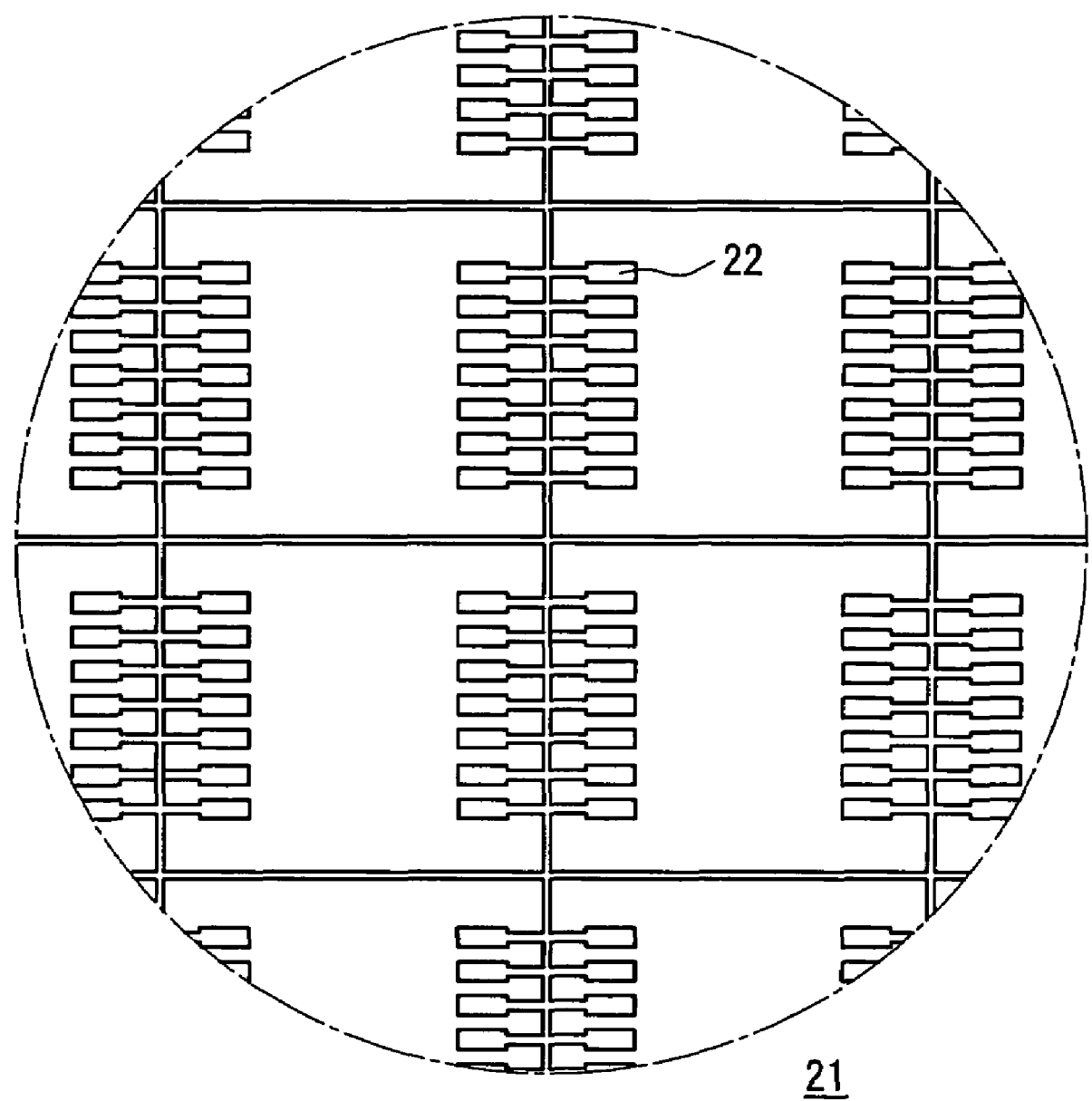
FIG. 6 is a top view of the lead frame which is used in this manufacturing method.

A plurality of metal lead pieces 9 are embedded in the housing 1 by insert molding. The metal lead pieces 9 are members for providing electrical leads from the internal space 4 of the housing 1 to the outside, and include an internal terminal portion 9a exposed at the surface of the base 2 on the side of the internal space 4, an external terminal portion 9b exposed at a position corresponding to the internal terminal portion 9a at the rear surface of the base 2, and a lateral electrode portion 9c exposed at the outer lateral surface of the base 2. The pad electrodes 5a of the imaging element 5 and the internal terminal portions 9a of the metal lead pieces 9 are connected by thin metal wires 10. The thickness of the overall package is set to not more than 2.0 mm, for example. FIG. 4 is a top view of the planar shape of the solid-state imaging device in FIG. 1 without the transparent plate 7.

As shown in FIG. 1, the rear side of the metal lead pieces 9 functions as the external terminal portions 9b, which correspond to the positions of the internal terminal portions 9a. Furthermore, at these portions the metal lead pieces 9 have substantially the same thickness as the base 2. Those portions of the metal lead pieces 9 that are located below the ribs 3 are formed thin by half-etching, and their bottom surface is covered by resin.

As shown in FIGS. 1 and 3, the outer lateral surface of the housing 1, that is to say the outer peripheral surface of the ribs 3, forms a planar surface that is substantially perpendicular to the surface of the base 2. Moreover, the end surface of the transparent plate 7 and the surface of the lateral electrode portions 9c are substantially flush with the outer lateral surface of the housing 1. Such a flush shape can be formed with a favorable flatness by cutting the ribs 3 and the transparent plate 7 together during the manufacturing process.

A method for manufacturing a solid-state imaging devices configured as above is explained with reference to FIGS. 5A to 5F, FIG. 6 and FIG. 7.

First, as shown in FIG. 5A, a lead frame 21 is prepared. The lead frame 21 is composed of a plurality of lead portions 22 to be used for forming the metal lead pieces 9 shown in FIG. 1, which are linked as shown in the top view in FIG. 6. The thickness of the lead portions 22 at the positions corresponding to the internal terminals 9a is adjusted to be substantially the same as the thickness of the base 2. The lead portions 22 have recessed portions 23 formed in their bottom surface by half-etching, and the shape of the metal lead pieces 9 shown in FIG. 1 is attained by cutting at this portion in a later process step.

Figure 7:
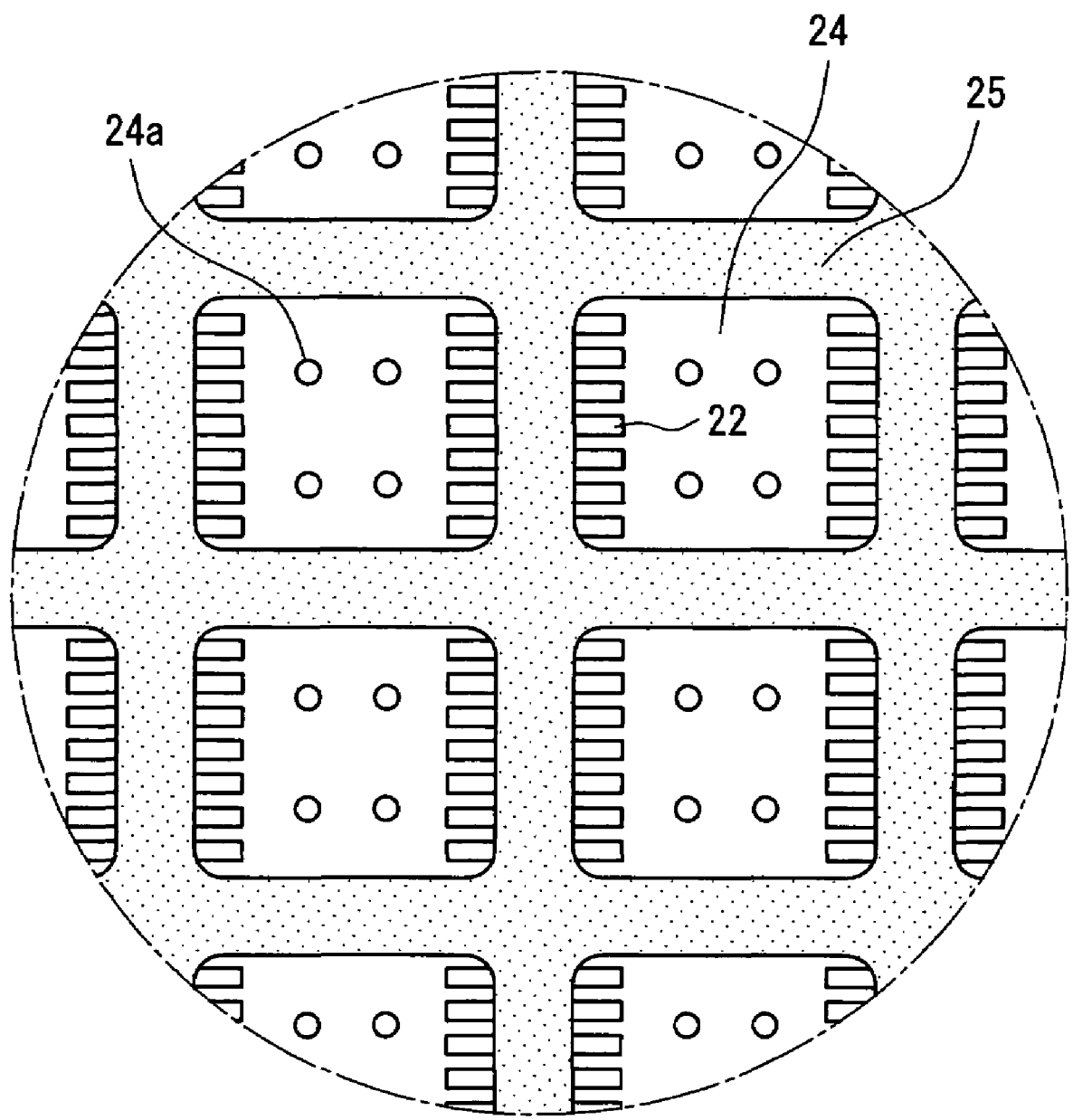
FIG. 7 is a top view of the molded resin product with the lead frame embedded in this manufacturing method.

Next, the lead frame 21 is embedded, as shown in FIG. 5B, and molded in one piece with a resin, thus fabricating together a plurality of housings 26 made of a base 24 and rib forming members 25. A plurality (the drawing shows 4 protrusions inside each housing) of the hemispherical protrusions 24a are formed on the upper surface of the base 24. FIG. 7 shows the planar shape after molding. The embedding is performed such that the upper and lower surfaces of the lead portions 22 are exposed at the upper and lower surface of the bases 24, forming the internal terminal portions 9a and the external terminal portions 9b, respectively. The rib forming members 25 are formed such that those for adjacent housings 26 are joined into one piece.

Next, as shown in FIG. 5C, the adhesive 6 is applied to the region of the housings 26 where the hemispherical protrusions 24a are formed and the imaging elements 5 are to be mounted. Thus, the imaging elements 5 are mounted such that they are supported on the hemispherical protrusions 24a and fixed by the adhesive 26. Furthermore, the pad electrodes 5a of the imaging element 5 and the internal terminal electrodes 9a are connected by the thin metal wires 10.

Next, as shown in FIG. 5D, an adhesive 28 is applied to the upper surface of the rib forming members 25, and a transparent plate 27 is placed thereon and fixed.

Then, as shown in FIG. 5E, the transparent plate 27, the rib forming members 25, the lead portions 22 and the base 24 are cut with a dicing blade 29, and separated into pieces forming individual solid-state imaging devices, as shown in FIG. 5F. As shown in FIG. 5E, the cutting is performed in a direction perpendicular to the base 24, such that the width of the rib forming members 25 in the planar shape is cut in half. As a result, the transparent plate 27, rib forming members 25, lead portions 22 and bases 24, which are thus cut, form a transparent plate 7, metal lead pieces 9 and housing 1 made of a base 2 and ribs 3 for constituting one solid-state imaging device. Moreover, the lateral electrode portions 9c of the metal lead pieces 9 are exposed.

According to this manufacturing method, the width of the one rib forming member 25 in which the two ribs for adjacent housing-equivalent portions 26 have been formed as one piece can be set to a smaller width than when each of the rib forming members 25 is molded individually. Consequently, when this one rib forming member 25 is cut in half as shown in FIG. 5E, the width of the ribs 3 of each individual solid-state imaging device as shown in FIG. 5F becomes smaller than when each of the rib forming members 25 is formed individually, and the surface area of the solid-state imaging device can be reduced accordingly.

Moreover, when cutting the rib forming members 25 into two pieces in the width direction, the cutting plane is perpendicular to the base 24, and the transparent plate 27 and the rib forming members 25 and the lead portions 22 are cut together with the same dicing blade 29. Therefore the lateral face of the package formed by the end face of the transparent plate 27, the lateral face of the housing 1 and the end face of the metal lead pieces 9, is substantially flush, so that a favorable flatness can be achieved. Consequently, when mounting a lens barrel accommodating the optical system above the imaging device, positioning of the optical system with respect to the photo-detecting portion of the imaging element 5 can be performed with high precision utilizing the lateral face of the package.

Referring to FIG. 8, the following is a more specific explanation of the process step for molding the housing with a resin, as shown in FIG. 5B of the above-described manufacturing process.

Figure 8A:
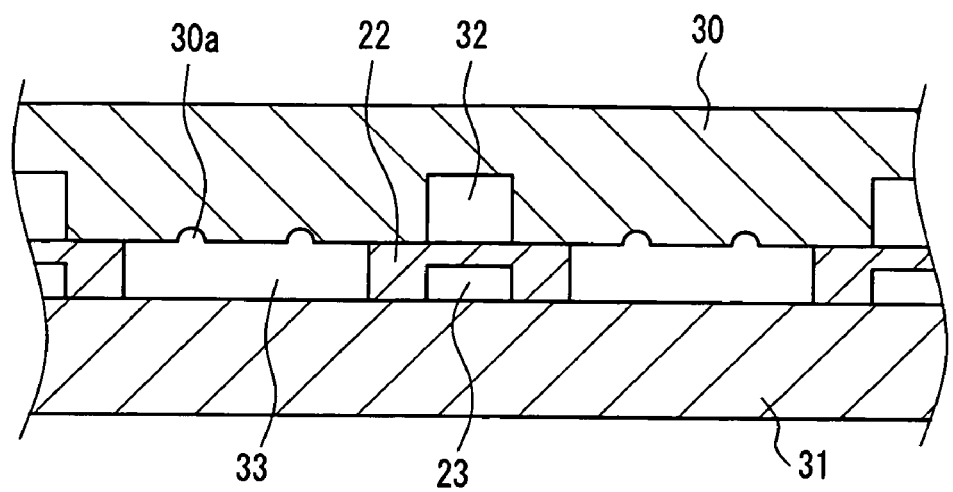
FIGS. 8A to 8C are a cross-sectional view showing the resin molding step of this manufacturing method in more detail.

First, as shown in FIG. 8A, a lead frame is arranged between the upper die 30 and the lower die 31, and the upper and lower surfaces of the lead portions 22 are clamped by the upper die 30 and the lower die 31. The upper surface of the lower die 31 is flat, but a recessed portion 32 is formed at the lower surface of the upper die 30. By interposing the lead portions 22, the empty portion 33 formed between the upper die 30 and the lower die 31, the empty portion of the recessed portion 32 of the upper die 30, and the empty portion of the recessed portion 23 of the lead portions 22 form the cavities for the resin molding. Hemispherical indentations 30a are formed on the surface of the upper mold facing the empty portion 33 for molding the base 24, at a position (see FIG. 5B) corresponding to the hemispherical protrusions 24a on the base 24.

Figure 8B:
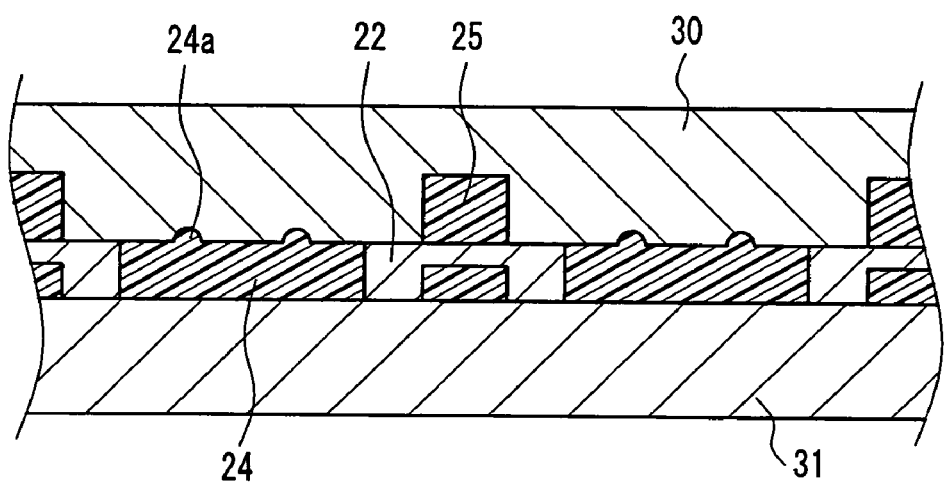
Figure 8C:
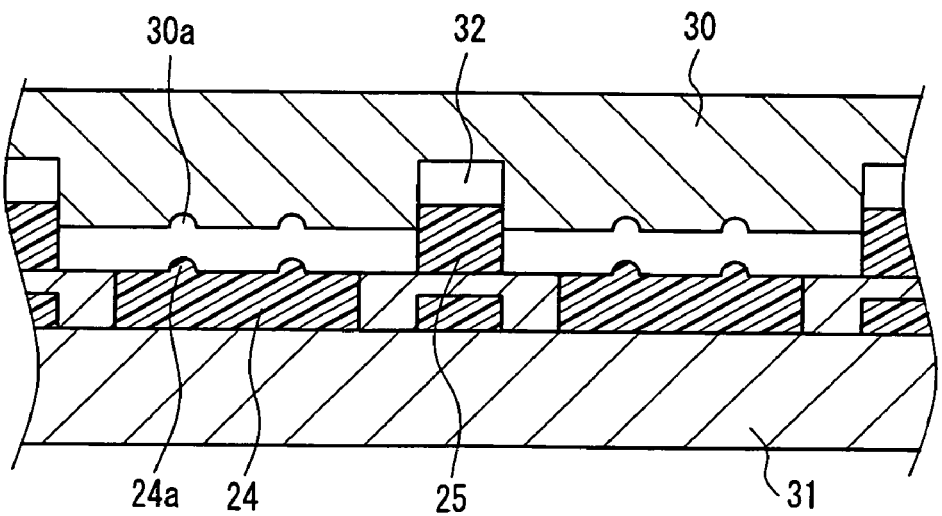
Figure 9:
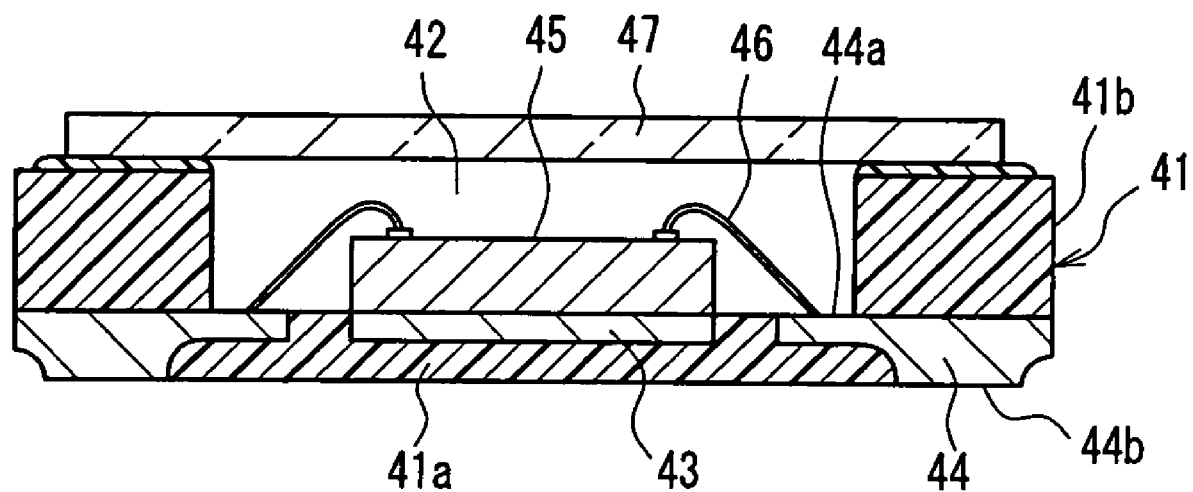
FIG. 9 is a cross-sectional view of a conventional solid-state imaging device.

Next, as shown in FIG. 8B, a resin is filled into the cavity, and the base 24 and the rib forming members 25 are molded. Hemispherical protrusions 24a are formed at the upper surface of the base 24. After that, the dies are opened as shown in FIG. 8C, and a molded product of linked housings as shown in FIG. 5B is retrieved.

According to this molding step, it is possible to form easily the hemispherical protrusions 24a without the addition of steps other than usual molding for forming the housing, and with only minor alterations to the upper die 30.

It should be noted that in this molding step, the upper and lower surfaces of the lead portions 22 are clamped by the upper die 30 and the lower die 31, ensuring that the die surfaces and the upper and lower surfaces of the lead portions 22 are consistently in close contact. Moreover, the border between the upper die 30 and the recessed portion 32 is located on the upper surface of the lead portions 22. As a result, the creation of resin burrs caused by the molding can be effectively suppressed.

Moreover, if a resin sheet for the prevention of resin flash burrs can be arranged between the dies and the lead frame 21 when resin molding the housing, then the creation of burrs can be suppressed even more effectively, The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
a base formed with a resin;
frame-shaped ribs provided on the base;
a plurality of wiring members embedded in the base so as to extend from an internal space of a housing formed by the base and the ribs to an external portion;
an imaging element fixed to the base inside the internal space;
a transparent plate fixed to an upper surface of the ribs; and
connecting members electrically connecting electrodes of the imaging element to the wiring members;
wherein a plurality of protrusions are provided on the base, and the imaging element is fixed by an adhesive to the base while being supported by the protrusions,
each of the wiring members has a thin portion and a thick portion,
the thin portion is located below the rib so as to be recessed from a lower surface of the thick portion,
a top surface of the thick portion is connected electrically to the connecting member,
a lower surface of the thick portion is exposed from the resin of the base, and
a lower surface of the thin portion is covered with the resin of the base.

2. The solid-state imaging device according to claim 1, wherein the number of protrusions is not less than 3.

3. The solid-state imaging device according to claim 1, wherein the protrusions are substantially hemispherical.

4. The solid-state imaging device according to claim 1, wherein the base and the ribs are molded as one piece with a resin with the wiring members embedded.

5. The solid-state imaging device according to claim 4, wherein the protrusions and the base are formed as one piece with a resin.

6. The solid-state imaging device of claim 1, wherein the number of protrusions is not greater than 5.

7. The solid-state imaging device according to claim 1, wherein the protrusions are made of resin.

8. The solid-state imaging device according to claim 1, wherein the protrusions are formed in a step of forming the base.

9. The solid-state imaging device according to claim 1, wherein the plurality of wiring members comprise a plurality of metal lead pieces.

10. The solid-state imaging device according to claim 1, wherein a thickness at the thick portion of the wiring member is substantially the same as a thickness of the base.

11. The solid-state imaging device according to claim 1, wherein an outer lateral surface of the housing is substantially flush with end faces of the wiring members.

12. The solid-state imaging device according to claim 11, wherein an end face of the transparent plate is substantially flush with the outer lateral surface of the housing and the end faces of the wiring members.

13. The solid-state imaging device according to claim 1, wherein the thin portion of the wiring members is exposed from the resin of the base at the side face of the base to permit connecting with an external element as a lateral electrode.

14. The solid-state imaging device according to claim 1, wherein the lower surface of the thick portion is exposed from the resin of the base at just under the top surface.

15. A solid-state imaging device, comprising:
a base formed with a resin;
frame-shaped ribs provided on the base;
a plurality of wiring members embedded in the base so as to extend from an internal space of a housing formed by the base and the ribs to an external portion;
an imaging element having a photo-detecting portion on a top surface region thereof and fixed to the base inside the internal space;
a transparent plate fixed to an upper surface of the ribs; and
connecting members electrically connecting electrodes of the imaging element to the wiring members;
wherein a plurality of protrusions are provided under a bottom surface of the imaging element, and the imaging element is fixed by an adhesive to the base while being supported from the bottom surface of the imaging element by the protrusions, each of the wiring members has a thin portion and a thick portion, the thin portion is located below the rib so as to be recessed from a lower surface of the thick portion a top surface of the thick portion is connected electrically to the connecting member, a lower surface of the thick portion is exposed from the resin of the base, and a lower surface of the thin portion is covered with the resin of the base.

16. The solid-state imaging device according to claim 15, wherein the number of protrusions is not less than 3.

17. The solid-state imaging device according to claim 15, wherein the protrusions are substantially hemispherical.

18. The solid-state imaging device according to claim 15, wherein the base and the ribs are molded as one piece with a resin with the wiring members embedded.

19. The solid-state imaging device according to claim 18, wherein the protrusions and the base are formed as one piece with a resin.

20. The solid-state imaging device according to claim 15, wherein the number of protrusions is not greater than 5.

21. The solid-state imaging device according to claim 15, wherein the protrusions are made of resin.

22. The solid-state imaging device according to claim 15, wherein the protrusions are formed in the step of forming the base.

23. The solid-state imaging device according to claim 15, wherein a thickness at the thick portion of the wiring member is substantially the same as a thickness of the base.

24. The solid-state imaging device according to claim 15, wherein an outer lateral surface of the housing is substantially flush with end faces of the wiring members.

25. The solid-state imaging device according to claim 24, wherein an end face of the transparent plate is substantially flush with the outer lateral surface of the housing and the end faces of the wiring members.

26. The solid-state imaging device according to claim 15, wherein the thin portion of the wiring member is exposed from the resin of the base at the side face of the base to permit connecting with an external element as a lateral electrode.

27. The solid-state imaging device according to claim 15, wherein the lower surface of the thick portion is exposed from the resin of the base at just under the top surface.

28. A solid-state imaging device, comprising:
a base formed with a resin;
frame-shaped ribs provided on the base;
a plurality of wiring members embedded in the base so as to extend from an internal space of a housing formed by the base and the ribs to an external portion;
an imaging element fixed to the base inside the internal space;
a transparent plate fixed to an upper surface of the ribs; and
connecting members electrically connecting electrodes of the imaging element to the wiring members;
wherein a plurality of protrusions are provided between the base and the imaging element, and the imaging element is fixed by an adhesive to the base while being supported by the protrusions,
each of the wiring members has a thin portion and a thick portion,
the thin portion is located below the rib so as to be recessed from a lower surface of the thick portion,
a top surface of the thick portion is connected electrically to the connecting member,
a lower surface of the thick portion is exposed from the resin of the base, and
a lower surface of the portion is covered with the resin of the base.

29. The solid-state imaging device according to claim 28, wherein a material of the protrusion is the same with that of the base.

30. The solid-state imaging device according to claim 28, wherein the protrusions are formed in a step of forming the base.

31. The solid-state imaging device according to claim 28, wherein a thickness at the thick portion of the wiring member is substantially the same as a thickness of the base.

32. The solid-state imaging device according to claim 28, wherein an outer lateral surface of the housing is substantially flush with end faces of the wiring.

33. The solid-state imaging device according to claim 32, wherein an end face of the transparent plate is substantially flush with the outer lateral surface of the housing and the end faces of the wiring members.

34. The solid-state imaging device according to claim 28, wherein the thin portion of the wiring member is exposed from the resin of the base at the side face of the base to permit connection with an external element as a lateral electrode.

35. The solid-state imaging device according to claim 28, wherein the lower surface of the thick portion is exposed from the resin of the base at just under the top surface.

* * * * *